(12) United States Patent
Ishikawa et al.

(10) Patent No.: US 10,942,384 B2
(45) Date of Patent: Mar. 9, 2021

(54) DISPLAY DEVICE

(71) Applicant: Japan Display Inc., Tokyo (JP)

(72) Inventors: Tomokazu Ishikawa, Tokyo (JP);
Hitomi Hasegawa, Tokyo (JP);
Masashi Shishikura, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 16/537,639

(22) Filed: Aug. 12, 2019

(65) Prior Publication Data

US 2020/0064703 A1    Feb. 27, 2020

(30) Foreign Application Priority Data

Aug. 22, 2018  (JP) .............................. JP2018-155614

(51) Int. Cl.
| | | |
|---|---|---|
| *G02F 1/1333* | (2006.01) | |
| *G02F 1/1362* | (2006.01) | |
| *H01L 27/12* | (2006.01) | |
| *G02F 1/1345* | (2006.01) | |
| *G02F 1/1337* | (2006.01) | |

(52) U.S. Cl.
CPC ...... *G02F 1/133345* (2013.01); *G02F 1/1337* (2013.01); *G02F 1/13458* (2013.01); *G02F 1/136286* (2013.01); *H01L 27/124* (2013.01); *G02F 2001/133776* (2013.01)

(58) Field of Classification Search
CPC .............. G02F 1/1345; G02F 1/13458; G02F 2001/13456; G02F 1/133711; G02F 1/1337; G02F 2001/133776; G02F 1/133345; G02F 2001/133388
See application file for complete search history.

(56) References Cited

U.S. PATENT DOCUMENTS

| | | | | |
|---|---|---|---|---|
| 8,259,247 B2 * | 9/2012 | Sugiyama | ............. | G02F 1/1345 349/40 |
| 2007/0279565 A1 * | 12/2007 | Iwato | ............... | H02G 1/133711 349/139 |
| 2008/0137022 A1 * | 6/2008 | Komeno | ............... | G02F 1/1337 349/153 |
| 2009/0033857 A1 * | 2/2009 | Abe | .................... | G02F 1/13452 349/152 |
| 2012/0224118 A1 * | 9/2012 | Kanzaki | ............ | G02F 1/133711 349/58 |
| 2017/0235182 A1 * | 8/2017 | Abe | .................... | G02F 1/13458 257/72 |
| 2018/0180945 A1 * | 6/2018 | Shim | ................. | G02F 1/133723 |

FOREIGN PATENT DOCUMENTS

JP        2017-146450 A    8/2017

* cited by examiner

*Primary Examiner* — Jia X Pan
(74) *Attorney, Agent, or Firm* — Xsensus LLP (57) ABSTRACT

According to one embodiment, a display device includes a first substrate and a second substrate. The first substrate includes a first area including a display portion, a second area adjacent to the first area, and an organic film. The second substrate has a substrate end along a boundary between the first area and the second area, and overlaps the first area. The first substrate includes an alignment film located in the display portion, terminals located in the second area and connected to a signal source, and a first groove formed in the organic film and located between the substrate end of the second substrate and the terminals in the second area. The terminals are arranged in a first direction. The first groove extends in the first direction along the terminals.

14 Claims, 12 Drawing Sheets

DISPLAY DEVICE

CROSS-REFERENCE TO RELATED APPLICATIONS

This application is based upon and claims the benefit of priority from Japanese Patent Application No. 2018-155614, filed Aug. 22, 2018, the entire contents of which are incorporated herein by reference.

FIELD

Embodiments described herein relate generally to a display device.

BACKGROUND

Recently, a liquid crystal display device in which liquid crystal molecules are rotated by an electric field applied in a direction parallel to an array substrate has been considered in various ways. In one example, a liquid crystal display device in which an antistatic, transparent conductive film formed on a surface of a counter-substrate and a transparent conductive film formed in a terminal portion of an array substrate are connected to each other with a conductive tape has been disclosed.

DETAILED DESCRIPTION

In general, according to one embodiment, a display device comprises a first substrate and a second substrate. The first substrate comprises a first area including a display portion, a second area adjacent to the first area, and an organic film. The second substrate comprises a substrate end along a boundary between the first area and the second area, and overlaps the first area. The first substrate comprises an alignment film located in the display portion, a plurality of terminals located in the second area and connected to a signal source, and a first groove formed of the organic film and located between the substrate end of the second substrate and the terminals in the second area. The terminals are arranged in a first direction. The first groove extends in the first direction along the terminals.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, and the like of the respective parts are illustrated schematically in the drawings, rather than as an accurate representation of what is implemented, but such schematic illustration is merely exemplary, and in no way restricts the interpretation of the invention. In addition, in the specification and drawings, constituent elements which function in the same or a similar manner to those described in connection with preceding drawings are denoted by like reference numbers, and detailed descriptions thereof are omitted unless necessary.

Figure 1:
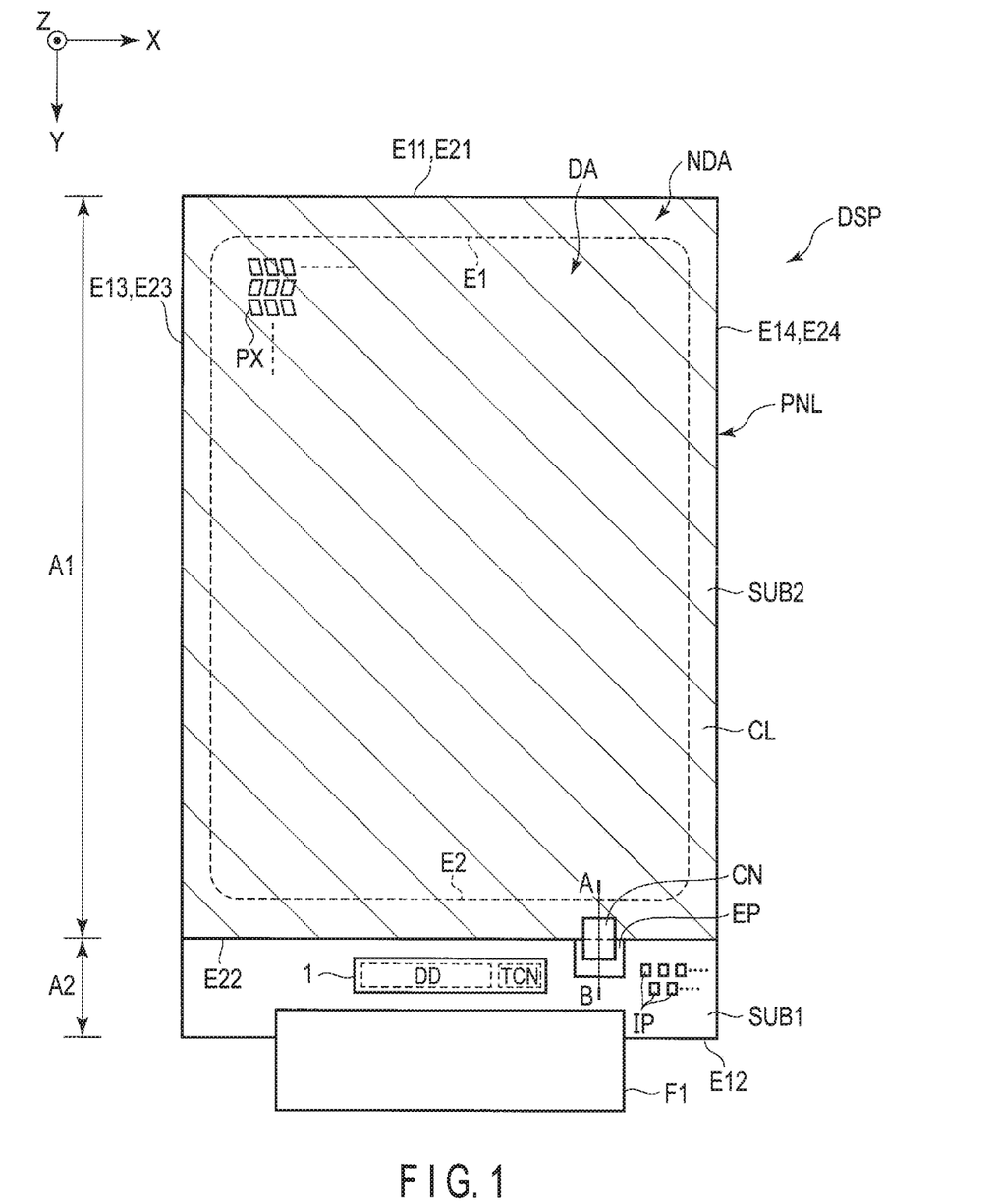
FIG. 1 is a plan view showing the first configuration example of a display device DSP of the present embodiment.

FIG. 1 is a plan view showing the first configuration example of a display device DSP of the present embodiment. A first direction X, a second direction Y and a third direction Z are orthogonal to each other in one example but may cross at an angle other than 90 degrees. The first direction X and the second direction Y correspond to directions parallel to the surface of a substrate constituting the display device DSP, and the third direction Z corresponds to the thickness direction of the display device DSP. In the specification, a position on the pointing end side of an arrow indicating the third direction Z will be referred to as above and a position on the opposite side to the pointing end side of the arrow will be referred to as below. In addition, an observation position at which the display device DSP is observed is assumed to be located on the pointing end side of the arrow indicating the third direction Z, and a view from this observation position toward an X-Y plane defined by the first direction X and the second direction Y will be referred to as planar view.

The display device DSP comprises a display panel PNL, an IC chip 1 and a wiring substrate F1.

The display panel PNL is a liquid crystal display panel, and comprises a first substrate SUB1, a second substrate SUB2, and a liquid crystal layer LC which will be described later. The display panel PNL comprises a display portion DA where an image is displayed, and a frame-shaped non-display portion NDA which surrounds the display portion DA.

The first substrate SUB1 has end portions E11 and E12 which extend in the first direction X, and end portions E13 and E14 which extend in the second direction Y. The second substrate SUB2 has end portions E21 and E22 which extend in the first direction X, and end portions E23 and E24 which extend in the second direction Y. The first substrate SUB1 comprises a first area A1 and a second area A2 which are arranged in the second direction Y. The second substrate SUB2 overlaps the first substrate SUB1 in the first area A1 but does not overlap the second area A2 in planar view. The end portion E22 corresponds to a substrate end along the boundary between the first area A1 and the second area A2.

That is, the first area A1 corresponds to an area surrounded by the end portions E11, E22, E13 and E14 in planar view. The second area A2 corresponds to an area surrounded by the end portions E12, E22, E13 and E14.

The display portion DA is included in the first area A1. The display portion DA has end portions E1 and E2 which extend in the first direction X. The display portion DA comprises a plurality of pixels PX arranged in a matrix in the first direction (row direction) X and the second direction (column direction) Y. The pixel PX here indicates a minimum unit which can be individually controlled according to a pixel signal, and may be referred to as a sub-pixel in some cases. The pixel PX is any one of a red pixel which displays red color, a green pixel which displays green color, a blue pixel which displays blue color, and a white pixel which displays white color, for example.

The outside of the display portion DA in the first area A1, and the second area A2 correspond to the non-display portion NDA. Although the IC chip 1 and the wiring substrate F1 may read signals from the display panel PNL in some cases, the IC chip 1 and the wiring substrate F1 mainly function as signal sources which supply signals to the display panel PNL. These signal sources are mounted on the second area A2. In the example illustrated, the wiring substrate F1 and the IC chip 1 are mounted on the second area A2. Alternatively, the IC chip 1 may be mounted on the wiring substrate F1, and this case will be described later. The IC chip 1 incorporates a display driver DD which outputs a signal necessary for displaying an image in an image display mode of displaying an image. In the example illustrated, the IC chip 1 also incorporates a touch controller TCN which controls a touch sensing mode of detecting approach or contact of an object to the display device DSP. The display driver DD and the touch controller TCN are shown by dotted lines in the drawing. The wiring substrate F1 is a bendable, flexible printed circuit board.

The first substrate SUB1 comprises a ground pad EP and inspection pads IP in addition to terminals (which will be described later) connected to the signal sources in the second area A2. In the example illustrated, the ground pad EP is located between the inspection pads IP and the IC chip 1. Note that the inspection pads IP may be located between the ground pad EP and the IC chip 1.

The second substrate SUB2 comprises a transparent conductive film CL. The transparent conductive film CL is formed almost entirely across an area which overlaps the first area A1, and also overlaps the pixels PX of the display portion DA. The transparent conductive film CL is formed of a transparent conductive material such as indium tin oxide (ITO) or indium zinc oxide (IZO).

A connecting member CN is located in the non-display portion NDA and electrically connects the ground pad EP and the transparent conductive film CL. The connecting member CN is a conductive paste or a conductive tape, for example.

The display panel PNL of the present embodiment may be any one of a transmissive display panel having a transmissive display function of displaying an image by selectively transmitting light from the rear surface side of the first substrate SUB1, a reflective display panel having a reflective display function of displaying an image by selectively reflecting light from the front surface side of the second substrate SUB2, and a transflective display panel having the transmissive display function and the reflective display function.

In addition, although the detailed configuration of the display panel PNL will not be described here, the display panel PNL may have any one of a configuration corresponding to a display mode using a lateral electric field along a substrate surface, a configuration corresponding to a display mode using a longitudinal electric field along a normal to a substrate surface, a configuration corresponding to a display mode using an inclined electric field inclined with respect to a substrate surface, and a configuration corresponding to a display mode using an appropriate combination of the lateral electric field, the longitudinal electric field and the inclined electric field. The substrate surface here is a surface parallel to the X-Y plane defined by the first direction X and the second direction Y.

Figure 2:
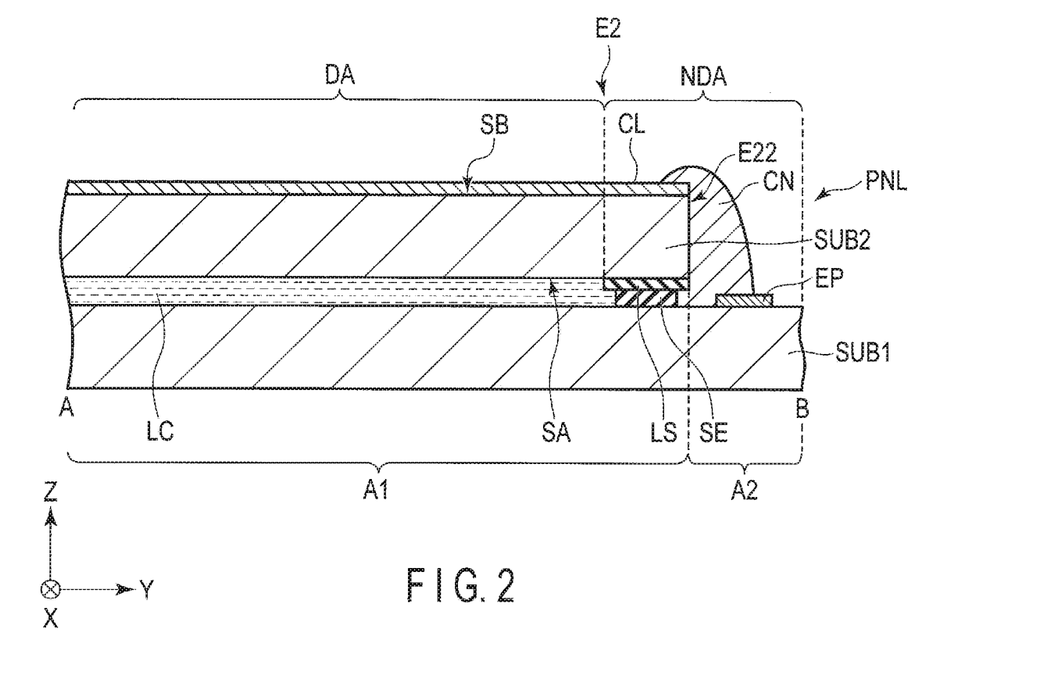
FIG. 2 is a cross-sectional view of a display panel PNL taken along line A-B shown in FIG. 1.

FIG. 2 is a cross-sectional view of the display panel PNL taken along line A-B shown in FIG. 1. Only constituent elements necessary for explanations are illustrated here.

The second substrate SUB2 comprises an inner surface SA facing the first substrate SUB1, and an outer surface SB on the opposite side to the inner surface SA side. A light-shielding layer LS is provided on the inner surface SA of the second substrate SUB2 and is located in the non-display portion NDA. An end portion E2 of the display portion DA corresponds to the inner end of the light-shielding layer LS. A sealant SE is located in the non-display portion NDA, bonds the first substrate SUB1 and the second substrate SUB2 together, and seals in the liquid crystal layer LC. The sealant SE is provided at a position overlapping the light-shielding layer LS. The transparent conductive film CL is provided on the outer surface SB and is provided across the display portion DA and the non-display portion NDA. Note that the transparent conductive film CL may be provided on the outer surface of an insulating substrate included in the second substrate SUB2 or may be provided on the outer surface of an optical element bonded to the insulating substrate.

The connecting member CN is in contact with the transparent conductive film CL at a position overlapping the sealant SE and the light-shielding layer LS. In addition, the connecting member CN is provided in the second area A2 of the first substrate SUB1 and is in contact with the ground pad EP.

Figure 3:
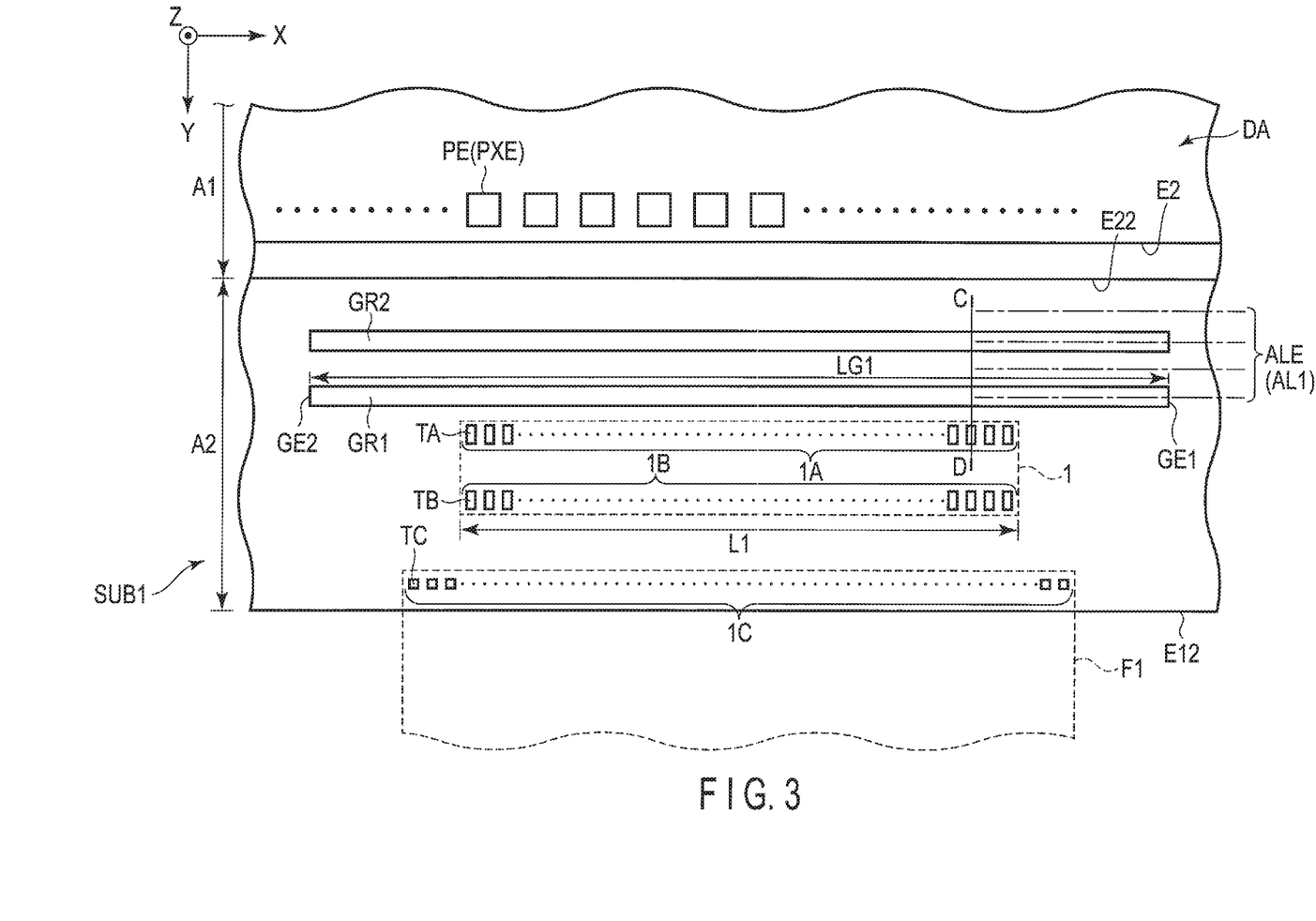
FIG. 3 is an enlarged plan view of a second area A2 including an IC chip 1 shown in FIG. 1.

FIG. 3 is an enlarged plan view of the second area A2 including the IC chip 1 shown in FIG. 1. Here, the IC chip 1 and the wiring substrate F1 are shown by dotted lines. The first substrate SUB1 comprises terminal groups 1A, 1B and 1C in the second area A2. The terminal group 10 is provided between the IC chip 1 and the end portion E12 and overlaps the wiring substrate F1. The terminal groups 1A and 1B are provided between the wiring substrate F1 and the end portion E22 and overlap the IC chip 1 in planar view. The terminal group 1A, the terminal group 1B and the terminal group 1C comprise a plurality of terminals TA, a plurality of terminals TB and a plurality of terminals TC which are arranged at intervals in the first direction X, respectively. The terminals TA and the terminals TB are electrically connected to the IC chip 1. The terminals TC are electrically connected to the wiring substrate F1.

The first substrate SUB1 comprises a groove (first row groove) GR1 and a groove (second row groove) GR2 in the second area A2. The grooves GR1 and GR2 are located between the display portion DA and the terminals TA of the terminal group 1A. Alternatively, the grooves GR1 and GR2 may be located between pixel electrodes PE of pixels PXE in the outermost circumference (or closest to the end portion E2) of the display portion DA and the terminals TA. In addition, the grooves GR1 and GR2 are located between the end portion E22 (or the first area A1) and the terminals TA in planar view. In the example illustrated, the grooves GR1 and GR2 are arranged with a gap in between in the second direction Y and extend in the first direction X. Note that more grooves GR may be provided or only the groove GR1 may be provided between the end portion E22 and the terminals TA. In addition, other grooves GR may be provided between the end portion E2 and the end portion E22.

An alignment film AL1 provided in the first substrate SUB1 is provided across the first area A1 including the display portion DA. An end portion ALE of the alignment film AL1 does not overlap the terminals TA and is located between the display portion DA and the groove GR1 as shown by dashed-dotted lines in the drawing. For example, the end portion ALE may be located in the groove GR1, may be located between the grooves GR1 and GR2, may be located in the groove GR2, or may be located between the groove GR2 and the pixel electrodes PE of the pixels PXE in the outermost circumference.

The groove GR1 has a length LG1 in the first direction X. The groove GR1 has an end portion GE1 and an end portion GE2 located on the opposite side to the end portion GE1 side. The IC chip 1 has a length L1 in the first direction X. The length LG1 is greater than or equal to the length L1. In the example illustrated, the length LG1 is greater than the length L1. The IC chip 1 is located between the end portion GE1 and the end portion GE2 in the first direction X. That is, the end portions GE1 and GE2 are located on the outside of the IC chip 1 in the first direction X. The length of the groove GR2 is substantially the same as the length LG1 of the groove GR1. In addition, the widths of the grooves GR1 and GR2 in the second direction Y are substantially the same.

The distance from the terminals TA to the end portion E2 in the second direction Y corresponds to several tens of times greater than the distance from the terminals TA to the groove GR1. That is, the groove GR1 is formed at a position close to the terminals TA between the end portion E2 and the terminals TA.

Figure 4:
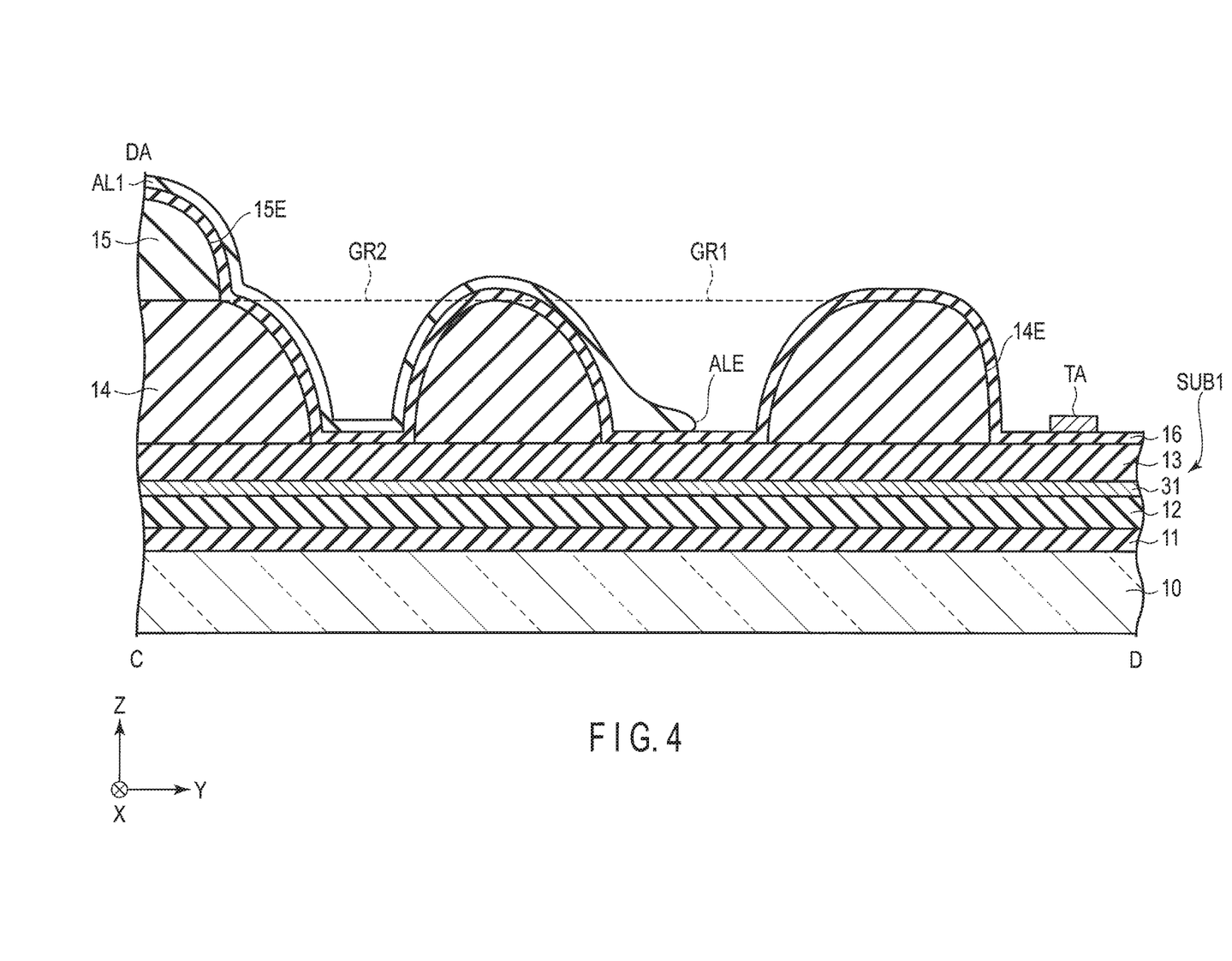
FIG. 4 is a cross-sectional view of a first substrate SUB1 taken along line C-D shown in FIG. 3.

FIG. 4 is a cross-sectional view of the first substrate SUB1 taken along line C-D shown in FIG. 3. The first substrate SUB1 comprises an insulating substrate 10, insulating films 11 to 16, a conductive layer 31, the alignment film AL1, and the like. The insulating substrate 10 is a transparent substrate such as a glass substrate or a flexible resin substrate. The insulating film 11 is located on the insulating substrate 10. The insulating film 12 is located on the insulating film 11. The conductive layer 31 is located on the insulating film 12 and is covered with the insulating film 13. The conductive layer 31 is, for example, a wiring line extending from the terminal TA shown in FIG. 3 toward the display portion DA. The insulating film 14 is located on the insulating film 13. The grooves GR1 and GR2 are formed in the insulating film 14. The grooves GR1 and GR2 penetrate the insulating film 14 and reach the insulating film 13 in the example illustrated, but the grooves GR1 and GR2 may be recesses which do not penetrate the insulating film 14. The insulating film 14 has an end portion 14E between the groove GR1 and the terminal TA. The insulating film 15 has an end portion 15E between the groove GR2 and the display portion DA. That is, the insulating film 15 does not exist at positions at which the grooves GR1 and GR2 are formed. The insulating film 16 covers the insulating films 14 and 15 and covers the insulating film 13 in the grooves GR1 and GR2. The detailed structure of the terminal TA will be described later. The alignment film AL1 is located on the insulating film 16. In the example illustrated, the end portion ALE of the alignment film AL1 is located in the groove GR1. That is, the alignment film AL1 does not cover the terminals TA.

Each of the insulating films 11 to 13 and the insulating film 16 is an inorganic insulating film formed of an inorganic material such as silicon oxide, silicon nitride or silicon oxynitride, and may have a single layer structure or a multilayer structure. Each of the insulating films 14 and 15 is, for example, an organic film formed of an organic insulating material such as acrylic resin. The insulating film 14 has a thickness of 2 μm to 3 μm, for example. The insulating film 15 has a thickness of 1 μm to 2 μm, for example. Note that the insulating film 15 may be an inorganic insulating film.

In the example illustrated in FIGS. 3 and 4, the grooves GR1 and GR2 correspond to the first groove, the insulating film 14 corresponds to the first organic film, and the insulating film 15 corresponds to the second organic film.

Figure 5:
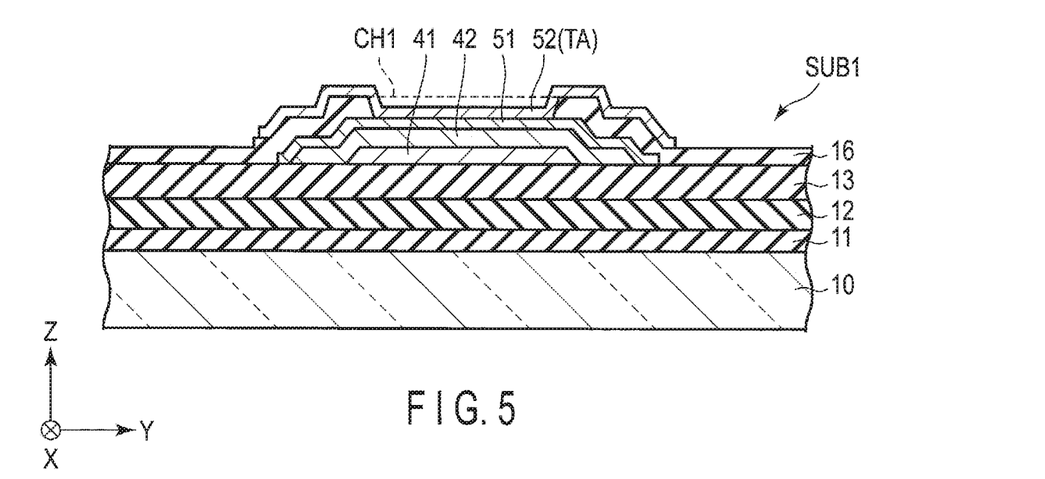
FIG. 5 is a cross-section view of a terminal TA shown in FIG. 4.

FIG. 5 is a cross-sectional view of the terminal TA shown in FIG. 4. A metal layer 41 is located on the insulating film 13. A metal layer 42 covers the metal layer 41. A transparent conductive layer 51 covers the metal layer 42. The insulating film 16 has a contact hole CH1 penetrating to the transparent conductive layer 51. A transparent conductive layer 52 is located on the insulating film 16 and is in contact with the transparent conductive layer 51 in the contact hole CH1. It is assumed that the terminal TA corresponds to the metal layer 41, the metal layer 42, the transparent conductive layer 51 or the transparent conductive layer 52, or a layered portion in which two or more of these layers are stacked one on top of another. The terminal TA is not necessarily specified as described above and may be considered as a conductive portion corresponding to a connecting portion which is connected to the IC chip.

The metal layer 41 is such a layered product that a layer containing titanium (Ti), a layer containing aluminum (Al) and a layer containing titanium (Ti) are stacked in this order, for example. The metal layer 42 is such a layered product that a layer containing molybdenum (Mo), a layer containing aluminum (Al) and a layer containing molybdenum (Mo) are stacked in this order, for example. Each of the transparent conductive layers 51 and 52 is formed of a transparent conductive material such as ITO or IZO.

According to the present embodiment, the first substrate SUB1 comprises the groove GR1 between the display portion DA and the terminal TA in the second area A2. At the time of printing the alignment film AL1, even if the alignment film AL1 spreads not only across the first area A1 but also across the second area A2, the alignment film AL1 flows in the groove GR1 and is dammed up on the display portion DA side of the terminal TA. Consequently, connection failure between the terminal TA and the IC chip 1 caused by the terminal TA being covered with the alignment film AL1 can be prevented, and yield can be improved.

Recently, the demand for narrowing the frame has been increasing, and the width of the non-display portion NDA tends to be decreasing. Also in areas where the signal sources are mounted, the demand for narrowing the frame has been increasing without exception. Therefore, the distance between the display portion DA and the signal sources decreases, and the acceptable range of the position of the end portion ALE of the alignment film AL1 tends to become narrower. In the present embodiment, even if the amount of the alignment film material to be printed varies, the excess alignment film material is absorbed in the groove GR1 between the terminal TA and the display portion DA. Therefore, it is possible to prevent the alignment film AL from spreading to the terminal TA.

In addition, since the groove GR1 is formed in an organic film, as compared to a groove formed in an inorganic insulating film, the depth of the groove GR1 can be increased and the acceptable volume of the alignment film material can be increased.

Figure 6:
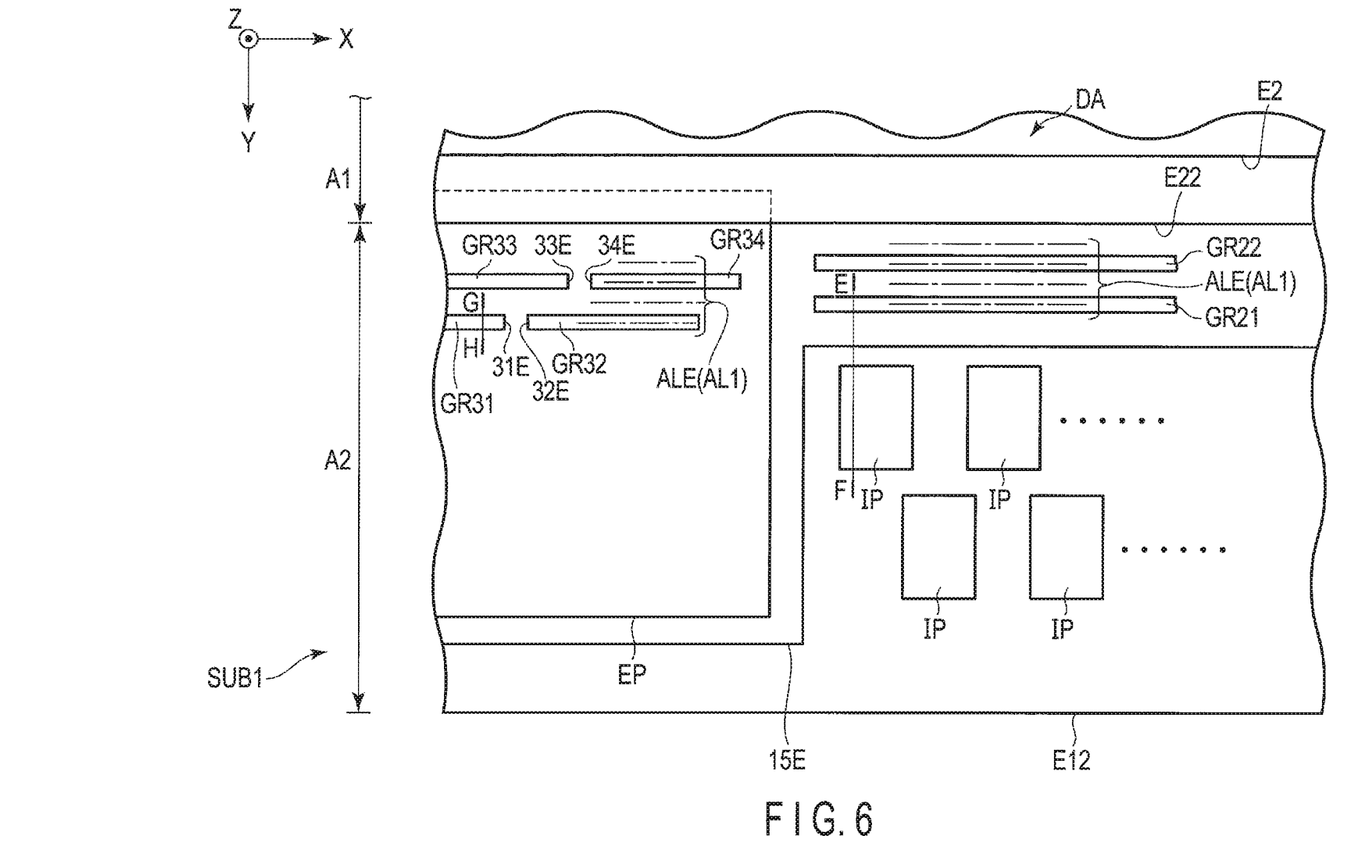
FIG. 6 is an enlarged plan view of the second area A2 including a ground pad EP and inspection pads IP shown in FIG. 1.

FIG. 6 is an enlarged plan view of the second area A2 including the ground pad EP and the inspection pads IP shown in FIG. 1.

The inspection pads IP are pads which receive inspection signals for inspecting disconnection, etc., in the display portion DA. The inspection pads IP are arranged at intervals in the first direction X. The inspection pads IP are arranged in two lines in a staggered manner in the example illustrated, but the inspection pads IP may be arranged in one line. The cross-sectional structure including the inspection pad IP is similar to that shown in FIG. 5, for example. The first substrate SUB1 comprises grooves GR21 and GR22 in the second area A2. The grooves GR21 and GR22 are located between the display portion DA and the inspection pads IP. Alternatively, the grooves GR21 and GR22 are located between the end portion E2, the end portion E22 or the first area A1, and the inspection pads IP in planar view. In the example illustrated, the grooves GR21 and GR22 are arranged with a gap in between in the second direction Y and extend in the first direction X. Note that more grooves GR may be provided or only the groove GR21 may be provided between the end portion E2 and the inspection pads IP.

The ground pad EP is electrically connected to the terminals TC shown in FIG. 2 and is grounded via the wiring substrate F1, for example. The first substrate SUB1 comprises a plurality of grooves GR31 to GR34 in the second area A2. The grooves GR31 to GR34 overlap the ground pad EP. In the example illustrated, the grooves GR31 to GR34 are located on the end portion E22 side but are not located on the end portion E12 side in the area overlapping the ground pad EP. The illustration of the connecting member CN shown in FIG. 1 is omitted here.

The grooves GR31 and GR32 are arranged with a gap in between in the first direction X. Similarly, the grooves GR33 and GR34 are arranged with a gap in between in the first direction X. The grooves GR31 and GR34 extend in the first direction X. In addition, the grooves GR31 to GR34 are arranged in a staggered manner. That is, the groove GR31 has an end portion 31E facing the groove GR32, and the groove GR32 has an end portion 32E facing the groove GR31. The groove GR33 and the end portions 31E and 32E are arranged in the second direction Y. Similarly, the groove GR33 has an end portion 33E facing the groove GR34, and the groove GR34 has an end portion 34E facing the groove GR33. The end portions 33E and 34E and the groove GR32 are arranged in the second direction Y.

The insulating film 15 overlaps the grooves GR21 and GR22, overlaps the ground pad EP, and does not overlap the inspection pads IP in the second area A2. That is, the end portion 15E of the insulating film 15 is located between the groove GR21 and the inspection pads IP, between the ground pad EP and the inspection pads IP, and between the ground pad EP and the end portion E12.

The alignment film AL1 provided in the first substrate SUB1 is provided across the first area A1 including the display portion DA. For example, the end portion ALE of the alignment film AL1 may be located in the groove GR21, may be located between the grooves GR21 and GR22, may be located in the groove GR22, or may be located between the groove GR22 and the substrate end E22 as shown by a dashed-dotted line in the drawing. In addition, for example, the end portion ALE may be located in the groove GR32, may be located between the grooves GR32 and GR34, may be located in the groove GR34, or may be located between the groove GR34 and the substrate end E22 as shown by a dashed-dotted line in the drawing. Further, the end portion ALE overlaps the ground pad EP. Note that the alignment film AL1 does not overlap the inspection pads IP.

In the example shown in FIG. 6, the grooves GR21 and GR22 correspond to the second groove, and the grooves GR31 to GR34 correspond to the third groove.

Figure 7:
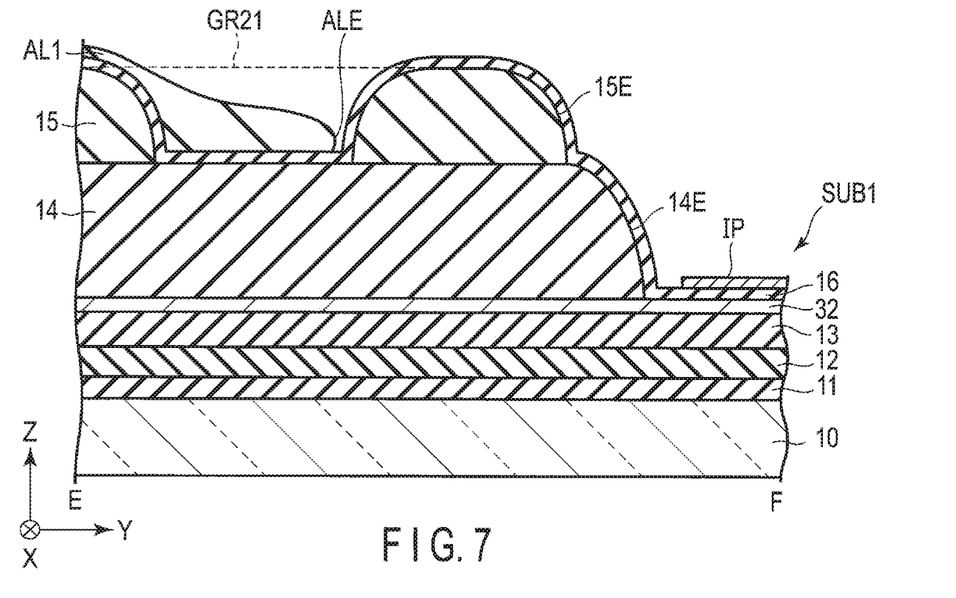
FIG. 7 is a cross-sectional view of the first substrate SUB1 taken along line E-F shown in FIG. 6.

FIG. 7 is a cross-sectional view of the first substrate SUB1 taken along line E-F shown in FIG. 6. The first substrate SUB1 comprises a conductive layer 32 located between the insulating films 13 and 14. The conductive layer 32 is formed of the same material as the metal layer 41 shown in FIG. 5, for example. The groove GR21 is located on the insulating film 14 and is formed in the insulating film 15. The groove GR21 penetrates the insulating film 15 and reaches the insulating film 14 in the example illustrated, but the groove GR21 may be a recess which does not penetrate the insulating film 15. The insulating film 16 covers the insulating film 15, and also covers the insulating film 14 in the groove GR21. In the example illustrated, the end portion ALE of the alignment film AL1 is located in the groove GR21. That is, the alignment film AL1 does not cover the inspection pad IP. Note that the cross-sectional structure of the groove GR22 shown in FIG. 6 is also similar to that of the groove GR21 illustrated in the drawing.

Therefore, in the process of inspecting the display portion DA, connection failure between a probe of an inspection device and the inspection pad IP can be prevented.

Figure 8:
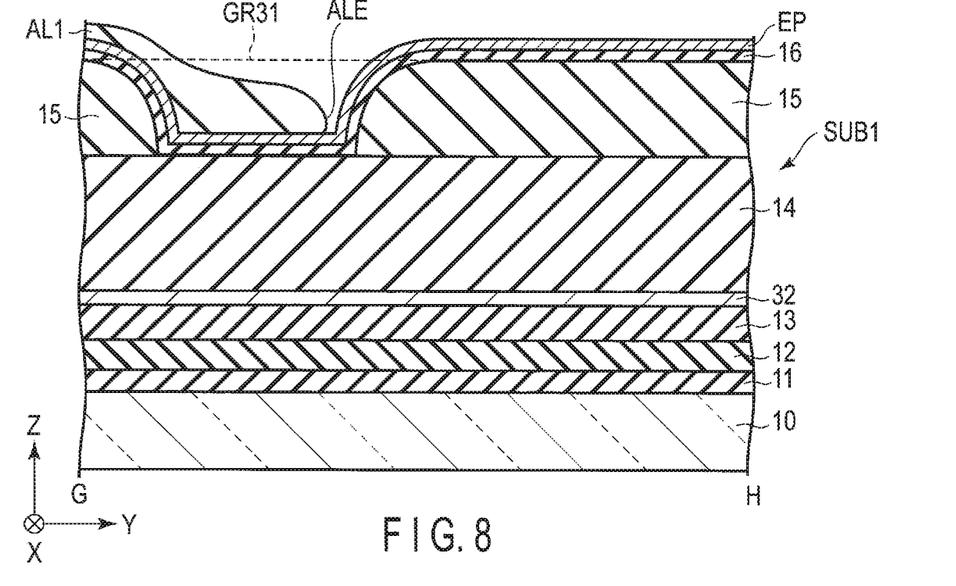
FIG. 8 is a cross-sectional view of the first substrate SUB1 taken along line G-H shown in FIG. 6.

FIG. 8 is a cross-sectional view of the first substrate SUB1 taken along line G-H shown in FIG. 6. The illustration of the connecting member CN shown in FIG. 1 is omitted here. The groove GR31 is located on the insulating film 14 and is formed in the insulating film 15. The groove GR31 penetrates the insulating film 15 and reaches the insulating film 14 in the example illustrated, but the groove GR31 may be a recess which does not penetrate the insulating film 15. The insulating film 16 covers the insulating film 15 and also covers the insulating film 14 in the groove GR31. The ground pad EP is located on the insulating film 16. The ground pad EP is formed of the same material as the transparent conductive layer 52 shown in FIG. 5. The alignment film AL1 is located on the ground pad EP, and in the example illustrated, the end portion ALE of the alignment film AL1 is located in the groove GR31. That is, while the alignment film AL1 covers the ground pad EP on the left side of the groove GR31 in the drawing, the alignment film AL1 does not cover the ground pad EP on the right side of the groove GR31 in the drawing. Note that the cross-sectional structures of the other grooves GR32 to GR34 shown in FIG. 6 are also similar to that of the groove GR31 illustrated in the drawing.

Therefore, the area to be connected to the connecting member CN can be secured in the ground pad EP, and connection failure between the ground pad EP and the connecting member CN can be prevented.

In addition, as shown in FIG. 6, the grooves GR31 to GR34 which overlap the ground pad EP are arranged in a staggered manner in planar view. Therefore, a large level difference will not be made in the insulating film 15 between the end portions 31E and 32E or between the end portions 33E and 34E, and disconnection of the ground pad EP can be prevented.

Figure 9:
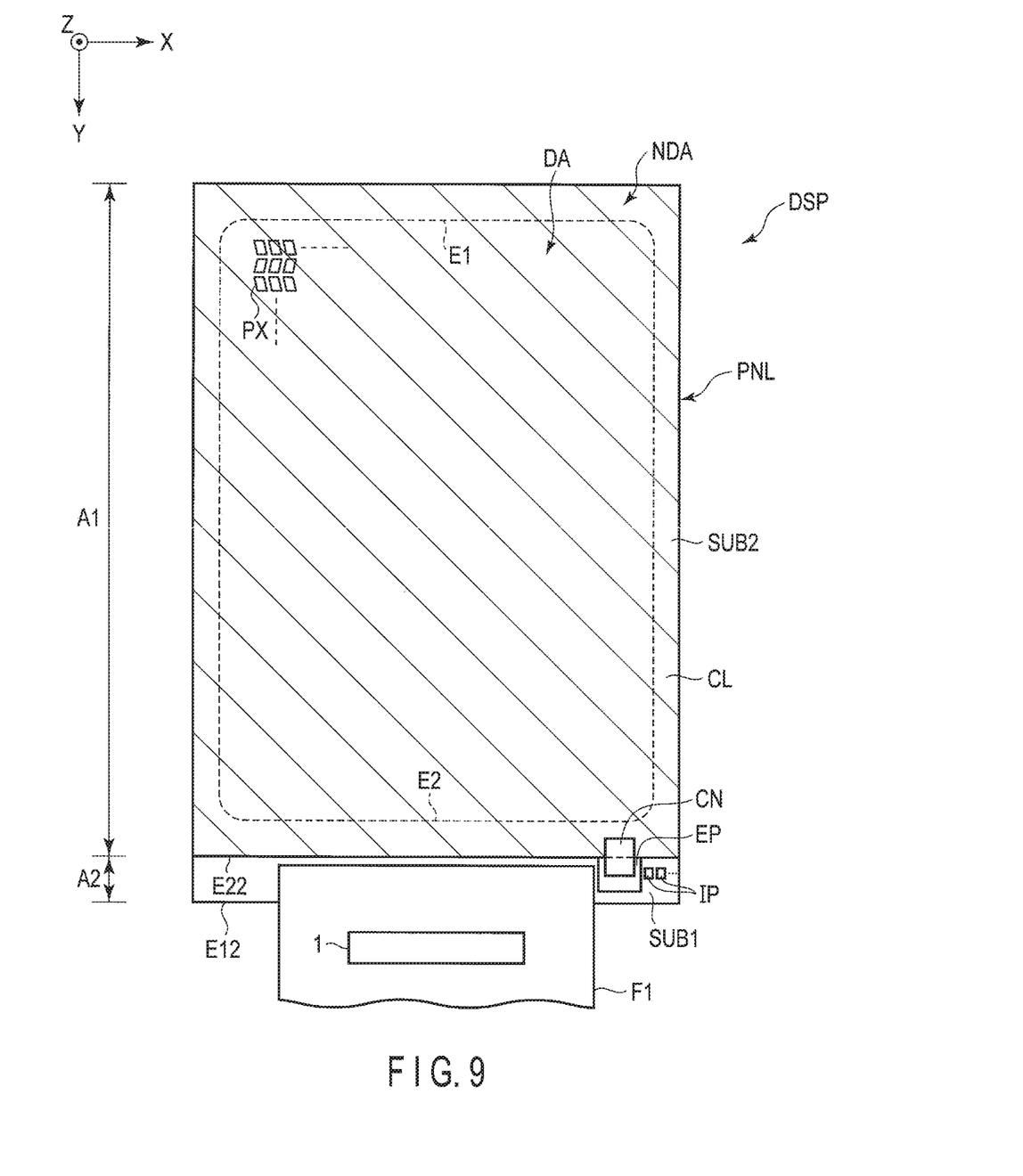
FIG. 9 is a plan view showing the second configuration example of the display device DSP of the present embodiment.

FIG. 9 is a plan view showing the second configuration example of the display device DSP of the present embodiment. The second configuration example shown in FIG. 9 differs from the first configuration example shown in FIG. 1 in that the wiring substrate F1 is mounted on the second area A2 of the first substrate SUB1 and the IC chip 1 is mounted on the wiring substrate F1. In the second configuration example, the width of the second area A2 in the second direction Y can be reduced as compared to the first configuration example.

Figure 10:
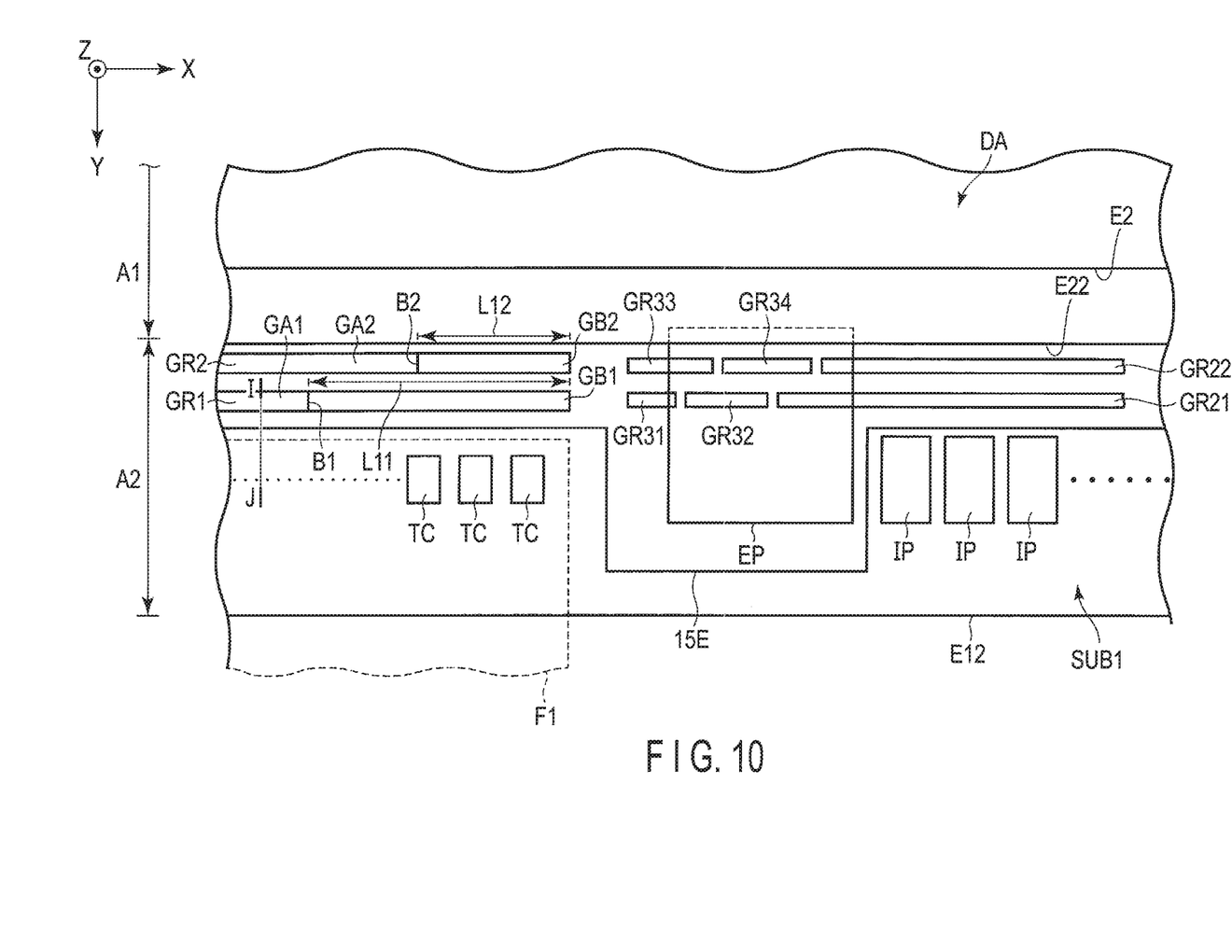
FIG. 10 is an enlarged plan view of the second area A2 shown in FIG. 9.

FIG. 10 is an enlarged plan view of the second area A2 shown in FIG. 9. Here, the wiring substrate F1 is shown by a dotted line. The first substrate SUB1 comprises the terminals TC, the inspection pads IP and the ground pad EP as is the case with the first configuration example. The grooves GR1 and GR2 are located between the display portion DA and the terminals TC. The grooves GR21 and GR22 are located between the display portion DA and the inspection pads IP. The grooves GR31 to GR34 overlap the ground pad EP and are arranged in a staggered manner.

The insulating film 15 overlaps the grooves GR1 and GR2, overlaps the grooves 21 and GR22, overlaps the ground pad EP, and does not overlap the terminals TC and the inspection pads IP in the second area A2. That is, the end portion 15E of the insulating film 15 is located between the groove GR1 and the terminals TC, between the ground pad EP and the end portion E12, between the groove GR21 and the inspection pads IP, between the terminals TC and the ground pad EP, and between the ground pad EP and the inspection pads IP.

The cross-sectional structures of the grooves GR21 and GR22 have been described with reference to FIG. 7. The cross-sectional structures of the grooves GR31 to GR34 have been described with reference to FIG. 8.

The groove (first row groove) GR1 has a first portion GR1 and a second portion GB1. The first portion GA1 and the second portion GB1 have different cross-sectional structures. Similarly, the groove (second row groove) GR2 has a first portion GA2 and a second portion GB2. In the example illustrated, a boundary B1 between the first portion GA1 and the second portion GB1 in the groove GR1 is deviated in the first direction X from a boundary B2 between the first portion GA2 and the second portion GB2 in the groove GR2. For example, a length L12 in the first direction X of the second portion GB2 is less than a length L11 in the first direction X of the second portion GB1.

The cross-sectional structures of the first portions GA1 and GA2 will be described later with reference to FIG. 11.

The cross-sectional structures of the second portions GB1 and GB2 are similar to that of the groove GR21, etc., and have been described with reference to FIG. 7. That is, the conductive layer 32 may be arranged in areas overlapping the second portions GB1 and GB2 in planar view. Therefore, if the grooves GR1 and GR2 penetrating the insulating film 14 are formed, the conductive layer 32 may be exposed. For this reason, in an area where the conductive layer 32 is arranged, the grooves GR1 and GR2 are formed in the insulating layer 15 and the insulating layer 14 is interposed between the conductive layer 32 and the grooves GR1 and GR2.

Figure 11:
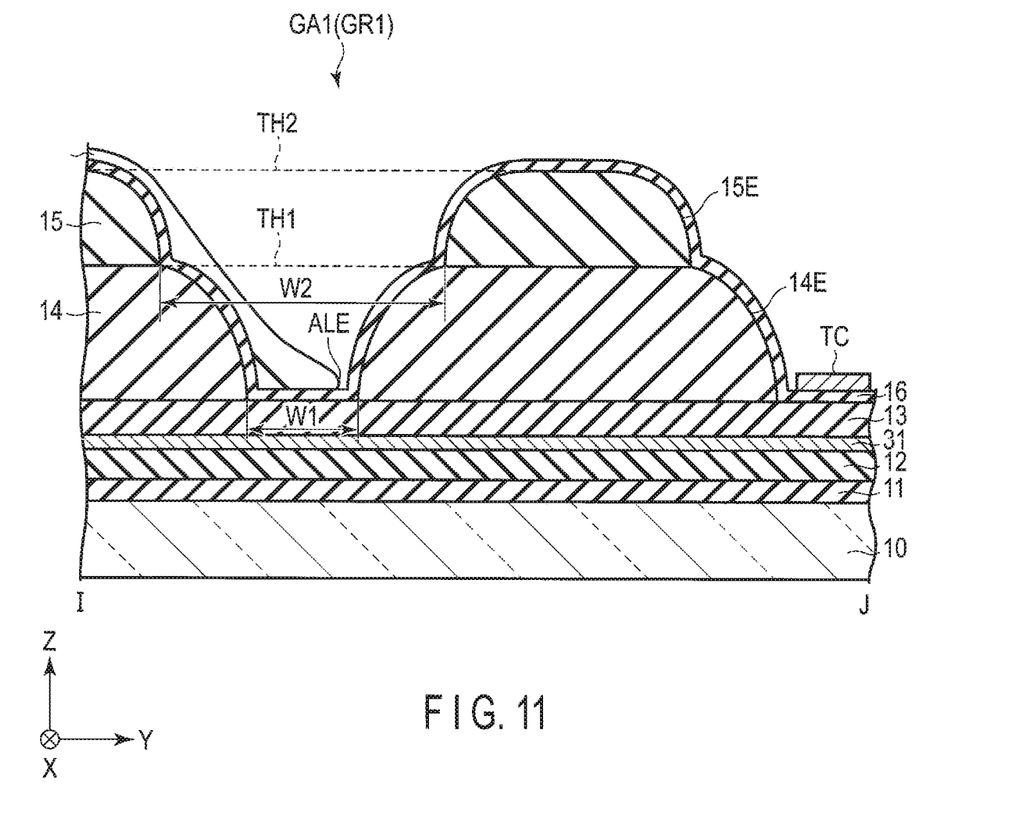
FIG. 11 is a cross-sectional view of the first substrate SUB1 taken along line I-J shown in FIG. 10.

FIG. 11 is a cross-sectional view of the first substrate SUB1 taken along line I-J shown in FIG. 10. The first portion GA1 of the groove GR1 is formed in the insulating films 14 and 15. In the example illustrated, the first portion GA1 is formed of a through hole TH1 formed in the insulating film 14 and a through hole TH2 formed in the insulating film 15. Note that the first portion GA1 may be formed of a recess which does not penetrate the insulating film 14, and the through hole TH2. A width W1 in the second direction Y of the through hole TH1 is less than a width W2 in the second direction Y of the through hole TH2. The insulating film 16 covers the insulating films 14 and 15, and covers the insulating film 13 in the first portion GA1. In the example illustrated, the end portion ALE of the alignment film AL1 is located in the first portion GA1. That is, the alignment film AL1 does not cover the terminal TC. Note that the cross-sectional structure of the first portion GA2 of the groove GR2 shown in FIG. 10 is also similar to that of the first portion GA1 illustrated in the drawing.

Therefore, connection failure between the terminal TC and the wiring substrate F1 caused by the terminal TC being covered with the alignment film AL1 can be prevented.

In the example illustrated, the conductive layer 32 does not exist immediately below the first portion GA1, and the conductive layer 31 is arranged between the insulating films 12 and 13. That is, the conductive layer 31 may be arranged but the conductive layer 32 is not arranged in areas overlapping the first portions GA1 and GA2 of FIG. 10 in planar view. Therefore, even if the first portions GA1 and GA2 which penetrate the insulating films 14 and 15 are formed, the conductive layer 31 will not be exposed, and the insulating layer 13 is interposed between the conductive layer 31 and the first portions GA1 and GA2.

Next, the main constituent elements of the display portion DA will be described.

Figure 12:
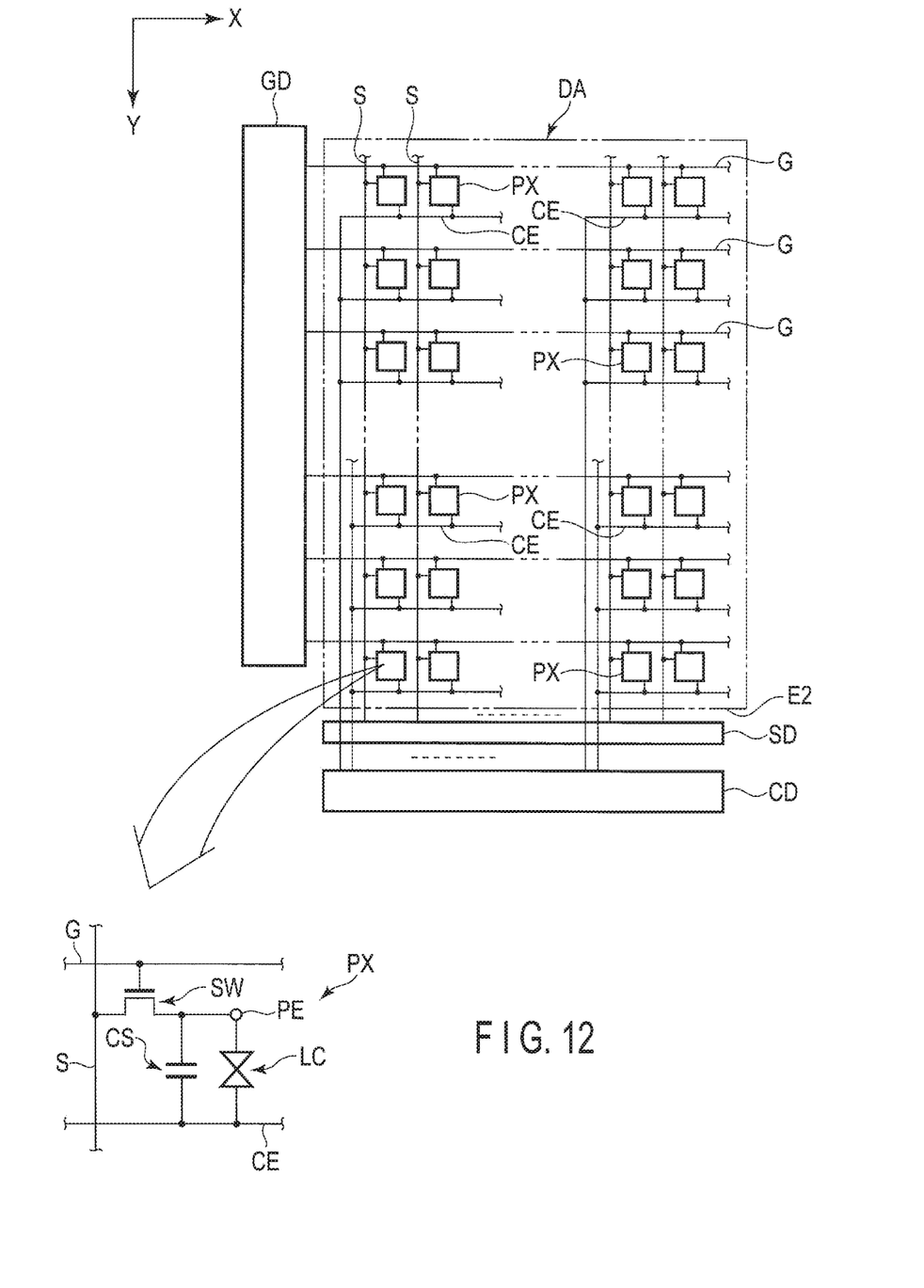
FIG. 12 is a diagram showing the basic configuration and equivalent circuit of a pixel PX.

FIG. 12 is a diagram showing the basic configuration and equivalent circuit of the pixel PX. A plurality of scanning lines G are electrically connected to a gate driver GD. A plurality of signal lines S are electrically connected to a source driver SD. The scanning lines G and the signal lines S are formed of a metal material such as aluminum (Al), titanium (Ti), silver (Ag), molybdenum (Mo), tungsten (W), copper (Cu) or chromium (Cr), or an alloy of these materials. The scanning lines G and the signal lines S may have a single layer structure or a multilayer structure. Note that the scanning lines G and the signal lines S do not necessarily extend linearly and may be partially bent. For example, even if the signal lines S are partially bent, the signal lines S are assumed to extend in the second direction Y.

The common electrode CE is arranged over the pixels PX. The common electrode CE is electrically connected to a voltage supply unit CD and the touch controller TCN shown in FIG. 1. In the image display mode, the voltage supply unit CD supplies a common voltage (Vcom) to the common electrode CE. In the touch sensing mode, the touch controller TCN supplies a touch drive voltage different from the common voltage to the common electrode CE.

Each pixel PX comprises a switching element SW, the pixel electrode PE, the common electrode CE, the liquid crystal layer LC, and the like. The switching element SW is composed of, for example, a thin-film transistor (TFT) and is electrically connected to the scanning line G and the signal line S. Each scanning line G is electrically connected to the switching elements SW of the pixels PX arranged in the first direction X. Each signal line S is electrically connected to the switching elements SW of the pixels PX arranged in the second direction Y. The pixel electrode PE is electrically connected to the switching element SW. Each pixel electrode PE faces the common electrode CE and drives the liquid crystal layer LC by an electric field generated between the pixel electrode PE and the common electrode CE. A capacitance CS is formed, for example, between an electrode at the same potential as the common electrode CE and an electrode at the same potential as the pixel electrode PE.

Figure 13:
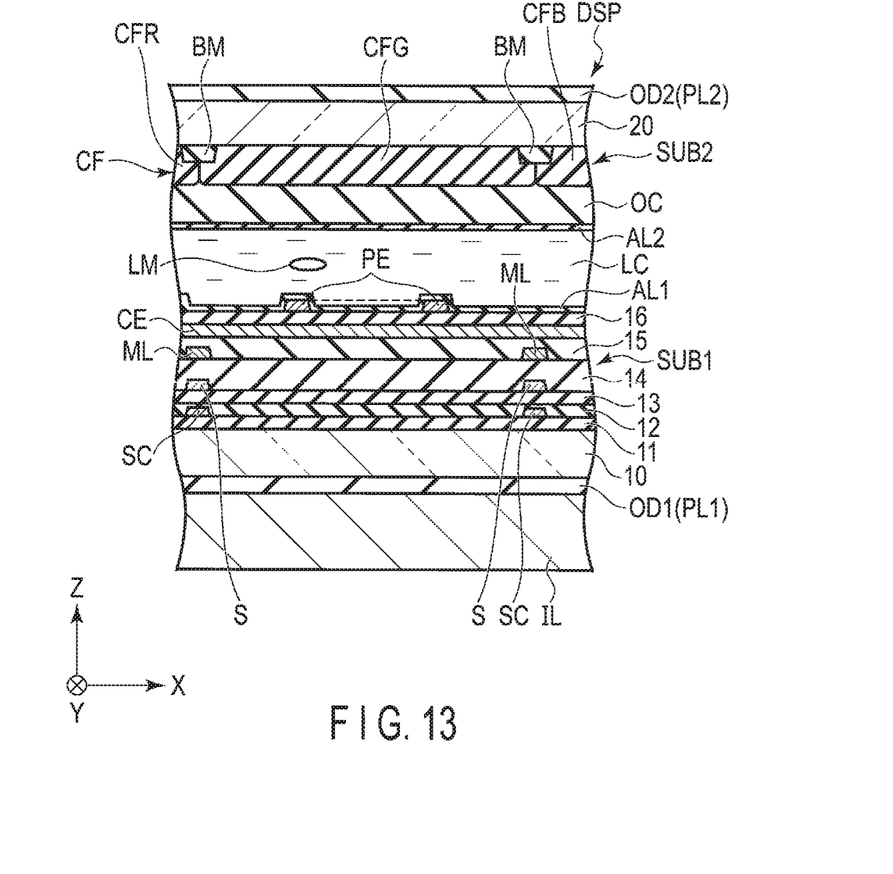
FIG. 13 is a cross-sectional view showing a configuration example of the display panel PNL shown in FIG. 1.

FIG. 13 is a cross-sectional view showing a configuration example of the display panel PNL shown in FIG. 1. The example illustrated corresponds to the case of adopting a fringe field switching (FFS) mode which is one of display modes using a lateral electric field.

The first substrate SUB1 comprises a semiconductor layer SC, the signal lines S, the metal lines ML, the common electrode CE, the pixel electrodes PE, the alignment film AL1, and the like. The semiconductor layer SC is located on the insulating film 11 and is covered with the insulating film 12. The semiconductor layer SC is formed of, for example, polycrystalline silicon but may be formed of amorphous silicon or oxide semiconductor. The scanning lines G shown in FIG. 12 are located between the insulating films 12 and 13 and are formed of the same material as the conductive layer 31 shown in FIG. 4, etc. The signal lines S are located on the insulating film 13 and are covered with the insulating film 14. The signal lines S are formed of the same material as the metal layer 41 shown in FIG. 5 and the conductive layer 32 shown in FIG. 7, etc. The metal lines ML are located on the insulating film 14 and are covered with the insulating film 15. The metal lines ML are formed of the same material as the metal layer 42 shown in FIG. 5. The metal lines ML extend parallel to the signal lines S and are located directly above the signal lines S, respectively.

The common electrode CE is located on the insulating film 15 and is covered with the insulating film 16. The common electrode CE is electrically connected to the metal line ML via a contact hole formed in the insulating film 15. The common electrode CE is formed of the same material as the transparent conductive layer 51 shown in FIG. 5, and is formed of a transparent conductive material such as ITO or IZO, for example. The pixel electrodes PE are located on the insulating film 16 and are covered with the alignment film AL1. The pixel electrodes PE face the common electrode CE via the insulating film 16. The pixel electrodes PE are formed of the same material as the transparent conductive layer 52 shown in FIG. 5 and are formed of a transparent conductive material such as ITO or IZO, for example.

The second substrate SUB2 comprises an insulating substrate 20, a light-shielding layer BM, a color filter layer CF, an overcoat layer OC, an alignment film AL2, and the like. The second substrate SUB2 may be referred to as a color filter substrate. The insulating substrate 20 is a transparent substrate such as a glass substrate or a flexible resin substrate as is the case with the insulating substrate 10. The color filter layer CF includes a red color filter CFR, a green color filter CFG and a blue color filter CFB. The color filter CFG faces the pixel electrode PE. The other color filters CFR and CFB face the other pixel electrodes PE, respectively. The overcoat layer OC covers the color filter layer CF. The overcoat layer OC is an organic insulating film formed of a transparent organic material. The alignment film AL2 covers the overcoat layer OC. Each of the alignment films AL1 and AL2 is formed of, for example, a material which exhibits horizontal alignment properties.

The liquid crystal layer LC is located between the first substrate SUB1 and the second substrate SUB2 and is held between the alignment film AL1 and the alignment film AL2. The liquid crystal layer LC comprises liquid crystal molecules LM. The liquid crystal layer LC is formed of a positive-type liquid crystal material (having positive dielectric anisotropy) or a negative-type liquid crystal material (having negative dielectric anisotropy).

An optical element OD1 including a polarizer PL1 is bonded to the insulating substrate 10. An optical element OD2 including a polarizer PL2 is bonded to the insulating substrate 20. Each of the optical elements OD1 and OD2 may comprise a retarder, a scattering layer, an antireflective layer, and the like when needed. An illumination device IL illuminates the first substrate SUB1 of the display panel PNL with white illumination light.

In the display panel PNL described above, the liquid crystal molecules LM are initially aligned in a predetermined direction between the alignment films AL1 and AL2 in an off state where an electric field is not formed between the pixel electrode PE and the common electrode CE. In the off state, the illumination light emitted from the illumination device IL toward the display panel PNL is absorbed in the optical elements OD1 and OD2, and dark display is thereby performed. On the other hand, in an on state where an electric field is formed between the pixel electrode PE and the common electrode CE, the liquid crystal molecules LM are aligned in a direction different from the initial alignment direction by the electric field, and the alignment direction is controlled by the electric field. In the on state, a part of the illumination light from the illumination device IL is transmitted through the optical elements OD1 and OD2, and bright display is thereby performed.

Figure 14:
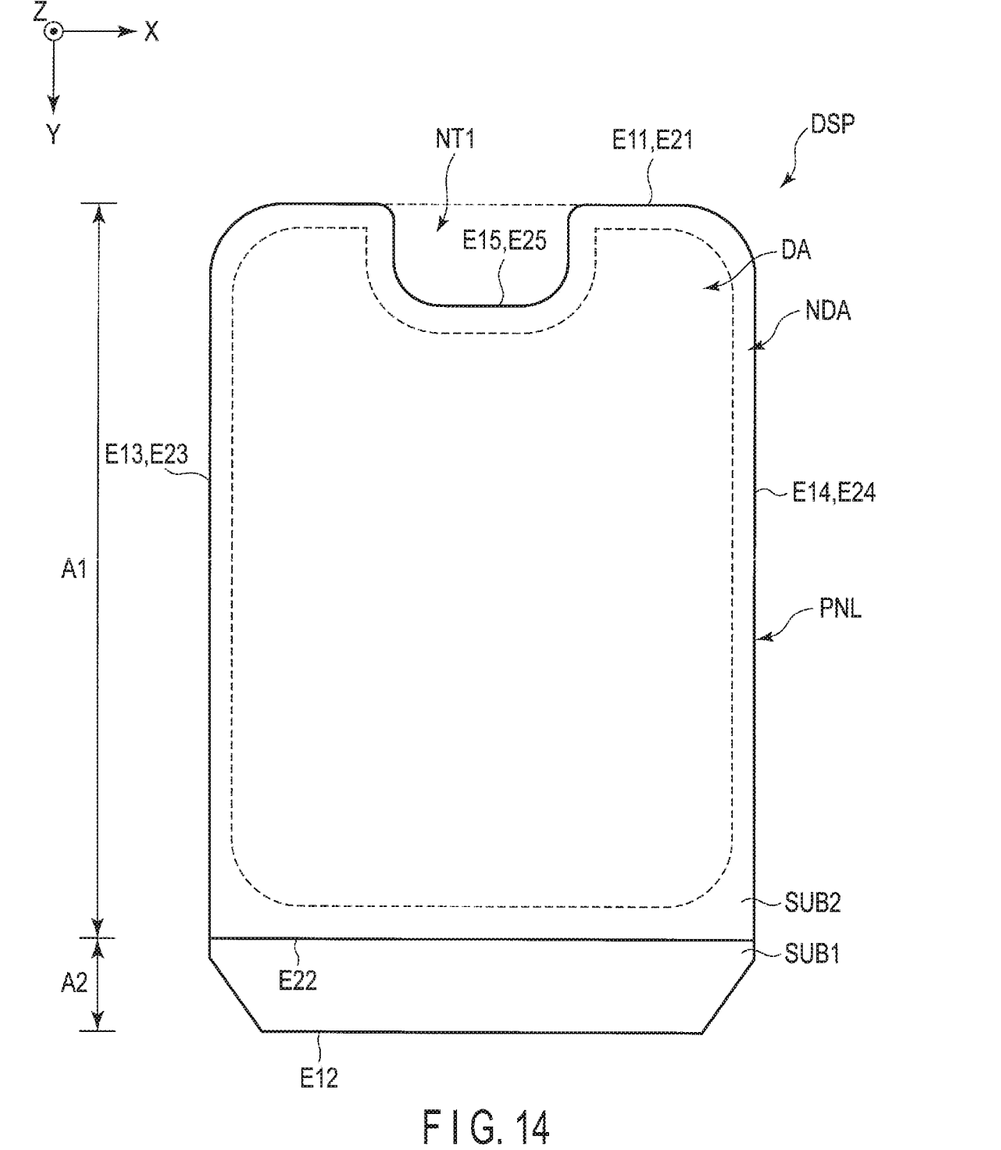
FIG. 14 is a plan view showing the third configuration example of the display device DSP of the present embodiment.

FIG. 14 is a plan view showing the third configuration example of the display device DSP of the present embodiment. The third configuration example shown in FIG. 14 differs from the first configuration example shown in FIG. 1 in the shape of the display panel PNL. That is, the display panel PNL has a notch NT1 on the opposite side to the second area A2 side in the first area A1. The first substrate SUB1 has an end portion E15 which is recessed from the end portion E11 toward the end portion E12. The second substrate SUB2 has an end portion E25 which is recessed from the end portion E21 toward the end portion E22. The end portions E15 and E25 overlap in planar view and constitute the notch NT1.

In the display panel PNL of the third configuration example described above, the IC chip 1 and the wiring substrate F1 may be mounted on the second area A2 as is the case with the first configuration example, or the wiring substrate F1 on which the IC chip 1 is mounted may be mounted on the second area A2 as is the case with the second configuration example.

As described above, according to the present embodiment, a display device which can improve yield can be provided.

While certain embodiments have been described, these embodiments have been presented by way of example only, and are not intended to limit the scope of the inventions. The novel embodiments described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the inventions.

What is claimed is:
1. A display device comprising:
  a first substrate comprising a first area including a display portion, a second area adjacent to the first area, and an organic film; and
  a second substrate comprising a substrate end along a boundary between the first area and the second area, and overlapping the first area, wherein
  the first substrate comprises an alignment film located in the display portion, a plurality of terminals located in the second area and connected to a signal source, and a first groove formed in the organic film and located between the substrate end of the second substrate and the terminals in the second area,
  the terminals are arranged in a first direction, the first groove extends in the first direction along the terminals, the signal source electrically connected to the terminals overlaps the terminals, and a length in the first direction of the first groove is greater than or equal to a length in the first direction of the signal source.

2. The display device of claim 1, wherein the alignment film has an end portion located between the substrate end of the second substrate and the first groove in a planar view.

3. The display device of claim 1, wherein the first substrate further comprises a plurality of inspection pads, and a second groove formed in the organic film and located between the substrate end of the second substrate and the inspection pads in the second area, the inspection pads are arranged in the first direction, and the second groove extends in the first direction along the inspection pads.

4. The display device of claim 1, wherein the first substrate further comprises a ground pad at a ground potential, and a plurality of third grooves formed in the organic film, and the third grooves overlap the ground pad and are arranged at intervals in the first direction.

5. The display device of claim 4, wherein the third grooves are arranged in a staggered manner.

6. The display device of claim 1, wherein the first substrate further comprises a metal line in the first area, the organic film comprises a first organic film arranged across the first area and the second area, and a second organic film arranged on the first organic film in the first area, the metal line is located between the first organic film and the second organic film, the second organic film has an end portion located between the display portion and the first groove, and the first groove is formed in the first organic film.

7. The display device of claim 1, wherein the first substrate further comprises a metal line in the first area, the organic film comprises a first organic film arranged across the first area and the second area, and a second organic film arranged on the first organic film in the first area, the metal line is located between the first organic film and the second organic film, and the first groove is located on the first organic film and is formed in the second organic film.

8. The display device of claim 1, wherein the first substrate further comprises a metal line in the first area, the organic film comprises a first organic film arranged across the first area and the second area, and a second organic film arranged on the first organic film in the first area, the metal line is located between the first organic film and the second organic film, and the first groove is formed in the first organic film and the second organic film.

9. The display device of claim 1, wherein the first substrate further comprises a metal line in the first area, the organic film comprises a first organic film arranged across the first area and the second area, and a second organic film arranged on the first organic film in the first area, the metal line is located between the first organic film and the second organic film, and the first groove has a first portion penetrating the first organic film and the second organic film, and a second portion penetrating the second organic film on the first organic film.

10. The display device of claim 9, wherein the first portion and the second portion are adjacent to each other in the first direction.

11. The display device of claim 10, wherein the first groove comprises a first row groove and a second row groove which are formed in the first direction between the substrate end of the second substrate and the terminals, the first row groove and the second row groove are arranged with a gap in between in a second direction crossing the first direction, each of the first row groove and the second row groove has the first portion and the second portion, and a boundary between the first portion and the second portion of the first row groove is deviated in the first direction from a boundary between the first portion and the second portion of the second row groove.

12. The display device of claim 1, wherein the alignment film has an end portion located in the first groove in a planar view, and the end portion of the alignment film is exposed to an outside of the substrate end of the second substrate.

13. The display device of claim 3, wherein the alignment film has an end portion located in the second groove in a planar view, and the end portion of the alignment film is exposed to an outside of the substrate end of the second substrate.

14. The display device of claim 4, wherein the alignment film has an end portion located in the third groove in a planar view, the end portion of the alignment film is exposed to an outside of the substrate end of the second substrate, and the end portion of the alignment film overlaps the ground pad.

* * * * *